US012585584B2

(12) United States Patent
Xiao et al.

(10) Patent No.: US 12,585,584 B2
(45) Date of Patent: Mar. 24, 2026

(54) SOLID STATE STORAGE DEVICE AND PATROL READ METHOD USING WORD LINE GROUPINGS THEREOF

(71) Applicant: KIOXIA CORPORATION, Tokyo (JP)

(72) Inventors: Bai-Jun Xiao, Hsinchu (TW); Kuan-Chun Chen, Hsinchu (TW); Yi-Che Yu, Hsinchu (TW); Tsukasa Tokutomi, Hsinchu (TW); Chun Yuan Lu, Hsinchu (TW); Chia-Hung Chen, Hsinchu (TW); Yu Hsiu Ho, Hsinchu (TW); Ching Lun Lu, Hsinchu (TW)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/806,776

(22) Filed: Aug. 16, 2024

(65) Prior Publication Data
US 2025/0181498 A1 Jun. 5, 2025

(30) Foreign Application Priority Data

Nov. 30, 2023 (CN) .......................... 202311628363.5
Nov. 30, 2023 (TW) ................................. 112146612

(51) Int. Cl.
*G11C 29/12* (2006.01)
*G06F 12/02* (2006.01)

(52) U.S. Cl.
CPC .... *G06F 12/0246* (2013.01); *G11C 29/12005* (2013.01); *G11C 2029/1202* (2013.01)

(58) Field of Classification Search
CPC .......... G06F 12/0246; G11C 29/12005; G11C 2029/1202
See application file for complete search history.

(56) References Cited

U.S. PATENT DOCUMENTS

| | | | |
|---|---|---|---|
| 2010/0131697 A1 | 5/2010 | Alrod et al. | |
| 2016/0141042 A1* | 5/2016 | Peterson ................ | G11C 16/20 |
| | | | 365/185.11 |
| 2016/0170871 A1* | 6/2016 | Hyun .................... | G06F 3/0653 |
| | | | 711/103 |
| 2019/0004734 A1* | 1/2019 | Kirshenbaum ....... | G06F 3/0679 |

(Continued)

OTHER PUBLICATIONS

Office Action issued on Sep. 4, 2024, in corresponding Taiwanese Application No. 112146612, 15 pages.

*Primary Examiner* — Tasnima Matin
(74) *Attorney, Agent, or Firm* — Maier & Maier, PLLC

(57) ABSTRACT

A solid-state storage device is provided, which includes a controller and a non-volatile memory. The controller selects a first word line group from a plurality of word line groups obtained by classifying the word lines based on a read threshold voltage of each word line, and a representative word line corresponding to each word line group is set based on the read threshold voltage associated with each word line group. The controller uses the read threshold voltage of a first representative word line corresponding to the first word line group to read page data of the first representative word line. When the controller cannot correctly read the page data of the first representative word line using the read threshold voltage of the first representative word line, the controller updates the read threshold voltage of the first representative word line in the first word line group.

10 Claims, 6 Drawing Sheets

400

S402 — Selecting a word line group

S404 — Using the read threshold voltage of the representative word line to read the page data of the representative word line S406 — Page data correctly read? — Yes No S408 — Updating the read threshold voltage of the representative word line in the word line group

(56)  References Cited

U.S. PATENT DOCUMENTS

| 2019/0066802 | A1* | 2/2019 | Malshe | G11C 29/52 |
|---|---|---|---|---|
| 2020/0350017 | A1* | 11/2020 | Lee | G11C 16/08 |
| 2021/0090682 | A1* | 3/2021 | Tokutomi | G11C 11/5642 |
| 2022/0113894 | A1 | 4/2022 | Avraham et al. | |
| 2023/0393755 | A1* | 12/2023 | Kaynak | G06F 3/0655 |
| 2024/0427500 | A1* | 12/2024 | Ciocchini | G06F 3/0679 |

* cited by examiner

S402 — Selecting a word line group

S404 — Using the read threshold voltage of the representative word line to read the page data of the representative word line S406 — Page data correctly read?

Yes

No

S408 — Updating the read threshold voltage of the representative word line in the word line group

400

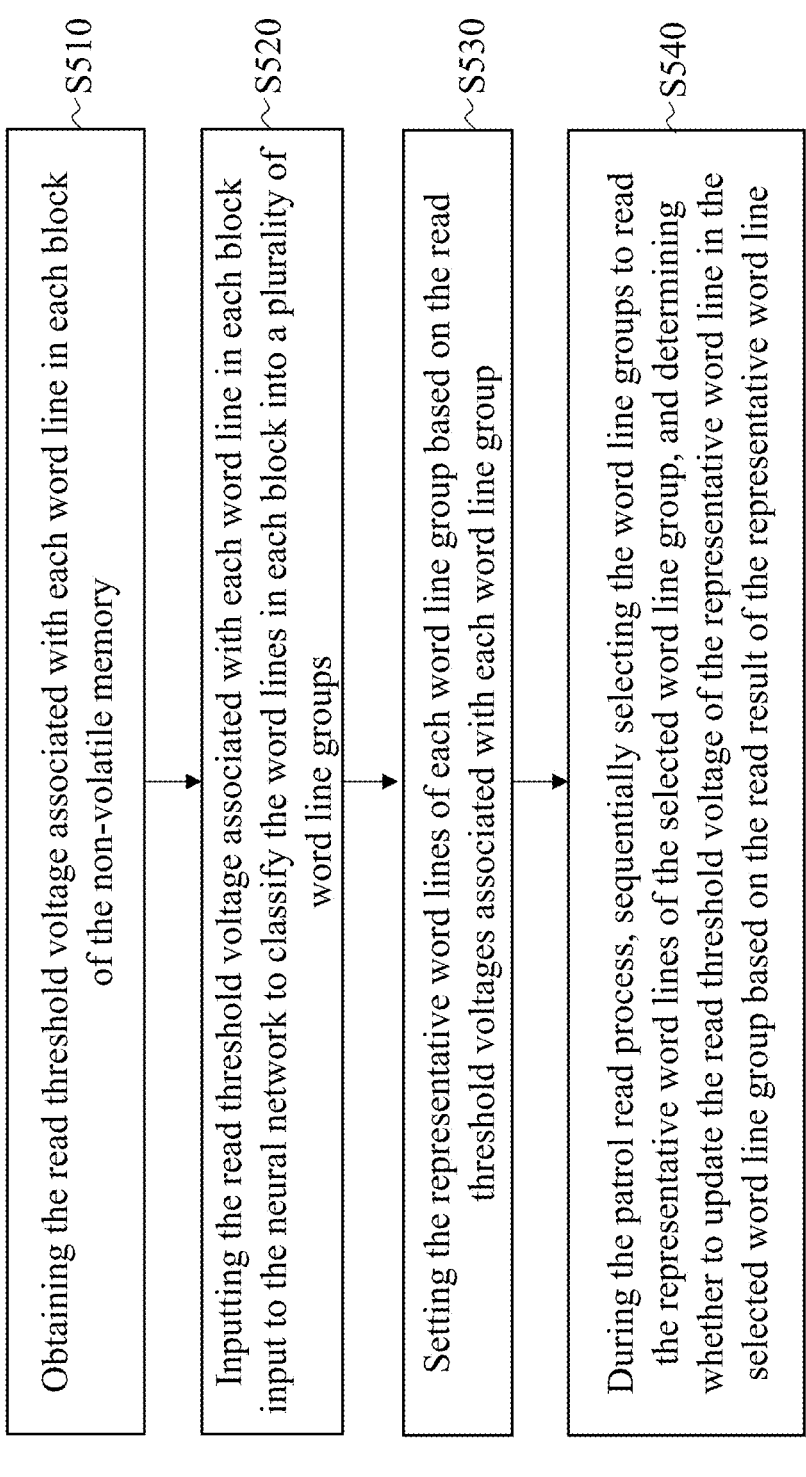

500

S510

Obtaining the read threshold voltage associated with each word line in each block of the non-volatile memory

S520

Inputting the read threshold voltage associated with each word line in each block input to the neural network to classify the word lines in each block into a plurality of word line groups

S530

Setting the representative word lines of each word line group based on the read threshold voltages associated with each word line group

S540

During the patrol read process, sequentially selecting the word line groups to read the representative word lines of the selected word line group, and determining whether to update the read threshold voltage of the representative word line in the selected word line group based on the read result of the representative word line

FIG. 5

SOLID STATE STORAGE DEVICE AND PATROL READ METHOD USING WORD LINE GROUPINGS THEREOF

CROSS-REFERENCE TO RELATED APPLICATIONS

The present application is based on, and claims priority from, Taiwan Application Serial Number 112146612, filed on Nov. 30, 2023, and China Application Serial Number 202311628363.5, filed on Nov. 30, 2023, the disclosures of which are hereby incorporated by reference in their entirety.

FIELD OF THE DISCLOSURE

The present disclosure relates to solid-state storage devices, and, in particular, a solid-state storage device and patrol read method using word line groupings thereof.

BACKGROUND

Solid state storage devices use non-volatile memory to store data they are widely used in various computer systems. Non-volatile memory is composed of a plurality of flash memory cells arranged and interconnected through multiple word lines and bit lines. When reading data stored in the non-volatile memory, a previously set read threshold voltage is applied to a corresponding word line. Due to offset of the previously set read threshold voltage by many factors, the solid state storage device performs a patrol read operation on the non-volatile memory. When a conventional solid-state storage device performs a patrol read operation, each word line in its non-volatile memory is read one by one to determine whether the error bit count in the read data is too high, in order to determine whether the read threshold voltage of the word line needs to be updated. In addition, since much memory space is required to store the read threshold voltage of each word line in conventional solid-state storage devices, a plurality of physically adjacent word lines are regarded as a group, and the word lines within the same group use the same the read threshold voltage. However, this method of grouping does not guarantee that the word lines within the same group are compatible with a single read threshold voltage. As a result, during individual patrol read operations on each word line, whenever the read threshold voltage of any word line in the group is updated, the common read threshold voltage used by the group will also be updated. In other words, if a certain number of word lines in the group have read threshold voltages updated, the read threshold voltage commonly used by the group is updated by a certain number of times. However, no matter the number of updates in a single group, the updated read threshold voltage is still not guaranteed to be suitable for all word lines in the group. The conventional patrol read operation is not only time consuming, but also generates frequent invalid read threshold voltage update operations and is prone to conflicts with write operations or read operations performed by the solid-state storage device, thereby reducing the performance of the solid-state storage device.

SUMMARY OF THE DISCLOSURE

Accordingly, a solid-state storage device and patrol read method using word line groupings thereof are provided to address the problems noted.

In an aspect of the present disclosure, a solid-state storage device is provided, which includes a controller and a non-volatile memory. The non-volatile memory includes a plurality of blocks, each block includes a plurality of word lines, and each word line has a corresponding read threshold voltage. The controller is configured to select a first word line group from a plurality of word line groups obtained by classifying the word lines based on the read threshold voltage of each word line, and a representative word line corresponding to each word line group is set based on the read threshold voltage associated with each word line group. The controller is further configured to use the read threshold voltage of a first representative word line corresponding to the first word line group to read page data of the first representative word line, and when the controller cannot correctly read the page data of the first representative word line using the read threshold voltage of the first representative word line, the controller is further configured to update the read threshold voltage of the first representative word line in the first word line group.

In another aspect of the present disclosure, a patrol read method using word line groupings for use in a solid-state storage device is provided. The solid-state storage device includes a controller and a non-volatile memory. The non-volatile memory includes a plurality of blocks. Each block comprises a plurality of word lines, and each word line has a corresponding read threshold voltage. The method includes the following steps: utilizing the controller to select a first word line group from a plurality of word line groups, wherein the plurality of word line groups are obtained by classifying the word lines based on the read threshold voltage of each word line, and a representative word line corresponding to each word line group is set based on the read threshold voltage associated with each word line group; utilizing the controller to use the read threshold voltage of a first representative word line corresponding to the first word line group to read page data of the first representative word line; and when the controller cannot correctly read the page data of the first representative word line using the read threshold voltage of the first representative word line, utilizing the controller to update the read threshold voltage of the first representative word line in the first word line group.

BRIEF DESCRIPTION OF THE DRAWINGS

Aspects of the present disclosure are best understood from the following detailed description when read with the accompanying figures. It is noted that in accordance with the standard practice in the industry, various features are not drawn to scale. In fact, the dimensions of the various features may be arbitrarily increased or reduced for clarity of discussion.

FIG. 5 is a flowchart of a word line classification method in accordance with the embodiment of FIG. 4.

DETAILED DESCRIPTION

The following description is for the purpose for describing preferred embodiments of the present disclosure, with the aim of describing the basic spirit of the present disclosure, but not to limit the present disclosure. The actual content of the disclosure should be referred to the appended claims.

It should be understood that the words "comprising" and "including" used in this specification are used to indicate the existence of specific technical features, numerical values, method steps, work processes, elements and/or components, but not to exclude additional technical features, numerical values, method steps, operations, elements, components, or any combination thereof.

The use of words such as "first", "second", and "third" in the scope of the patent application are used to modify the elements in the scope of the patent application, and are not used to indicate the priority order or precedence relationship between them, one component precedes another component, or the time sequence in which method steps are executed, and is only used to distinguish components with the same name.

The term "configured to" may describe or claim that various units, circuits, or other components are "configured to" perform a task or tasks. In such contexts, the term "configured to" is used by indicating that the units/circuits/components include a structure (e.g., circuitry) that performs their task(s) during operation. Thus, a specified unit/circuit/component may be said to be configured to perform the task even when the unit/circuit/component is not currently operating (e.g., not turned on). Such units/circuits/components used with the term "configured to" include hardware—for example: circuits, memory (which stores program commands that are executable to perform operations), etc. Additionally, "configured to" may include a generic structure (e.g., general circuitry) that is manipulated by software and/or firmware (e.g., an FPGA or a general-purpose processor executing the software) to operate in a manner that enables the execution of the task(s) to be solved. The term "configured to" may also include adapting a manufacturing process (e.g., a semiconductor manufacturing equipment) to produce a device (e.g., an integrated circuit) adapted to implement or perform one or more tasks.

Figure 1:
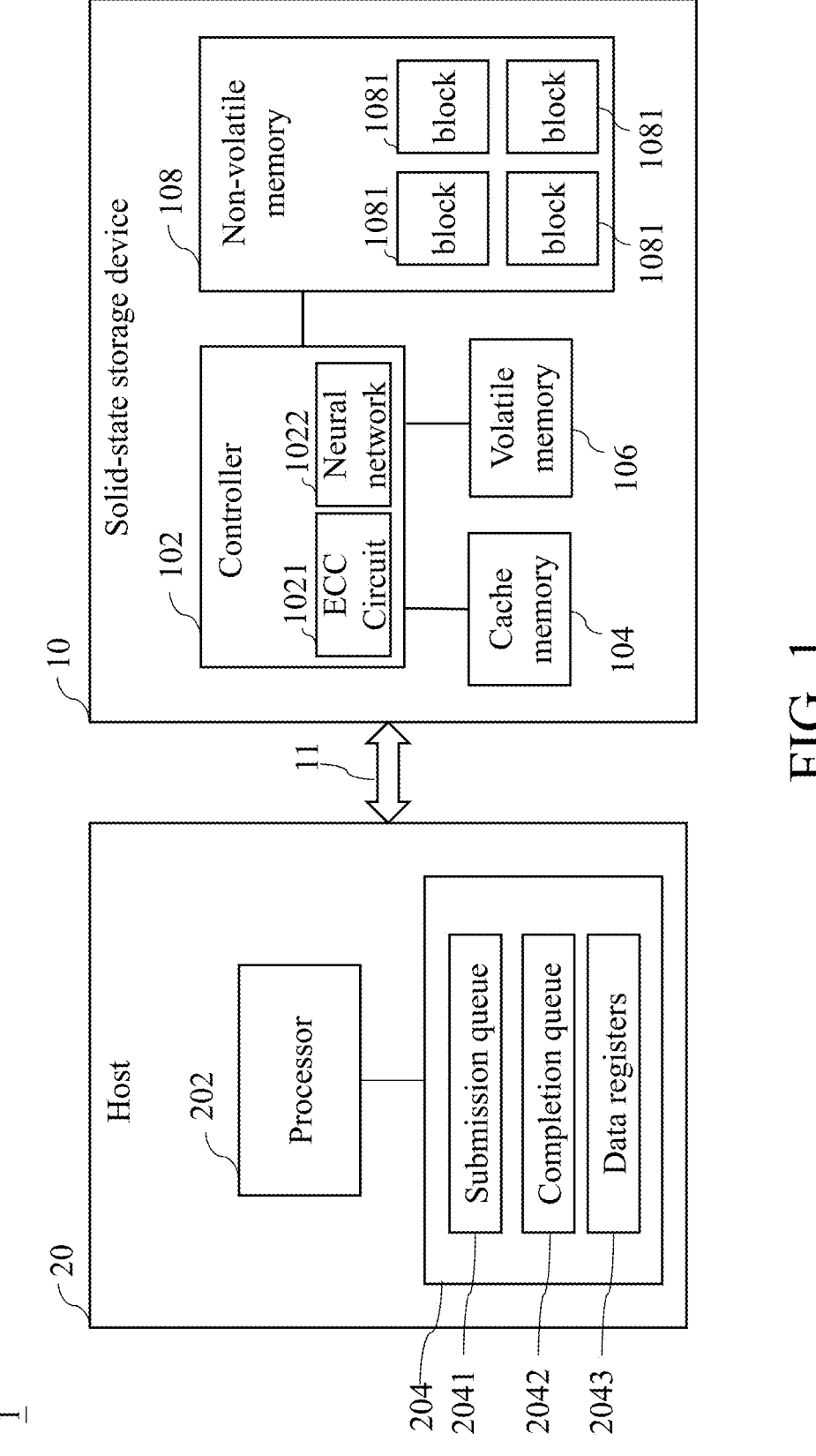
FIG. 1 is a block diagram of a computer system in accordance with an embodiment of the present disclosure.

FIG. 1 is a block diagram of a computer system in accordance with an embodiment of the present disclosure.

As shown in FIG. 1, the computer system 1 may include a solid-state storage device 10 and a host 20. The solid-state storage device 10 may be electrically connected to the host 20 through bus 11 for command and data transmission. In some embodiments, bus 11 may be a Universal Serial Bus (USB), a Serial Advanced Technology Attachment (SATA) bus, or a Peripheral Component Interconnect Express (PCI Express, PCIe) bus, etc., but the disclosure is not limited thereto.

The solid-state storage device 10 may include a controller 102, a cache memory 104, a volatile memory 106, and a non-volatile memory 108. The controller 102 may be electrically connected to the cache memory 104, the volatile memory 106, and the non-volatile memory 108, and used to control data access of the cache memory 104, the volatile memory 106, and the non-volatile memory 108. In some embodiments, the controller 102 may be, for example, a general-purpose processor, a microcontroller, an application-specific integrated circuit (ASIC), or a field programmable gate array (FPGA), etc., but the present disclosure is not limited thereto.

The cache memory 104 may include, for example, a static random access memory (SRAM). The volatile memory 106 may include, for example, a dynamic random access memory (DRAM), but the disclosure is not limited thereto. In some embodiments, the cache memory 104 and the volatile memory 106 may be disposed outside the controller 102. In some other embodiments, the cache memory 104 and the volatile memory 106 may be integrated into the controller 102. The non-volatile memory 108 may be, for example, a NAND flash memory storing write data provided by the host 20.

The host 20 may include, for example, a processor 202 and a system memory 204. The processor 202 is electrically connected to a system memory 204. In some embodiments, the processor 202 includes, for example, a central processing unit, a general-purpose processor, a microprocessor, etc., but the disclosure is not limited thereto. In addition, the processor 202 includes a controller (not shown) for controlling data access to the system memory 204. The system memory 204 includes, for example, a dynamic random access memory (DRAM), but the disclosure is not limited thereto.

In some embodiments, the host 20 can support the Non-Volatile Memory Express (NVMe) protocol, and the system memory 204 may be equipped with a submission queue 2041, a completion queue 2042, and data registers 2043. The submission queue 2041 may be configured to record the access commands issued by the processor 202, and the completion queue 2042 may be configured to record the status of the completed access commands from the solid-state storage device 10. The data registers 2043 may be configured to store data to be written to the solid-state storage device 10 by the host 20 and data read from the solid-state storage device 10 by the host 20.

In some embodiments, the solid-state storage device 10 can support the Non-Volatile Memory Express (NVMe) protocol, and the controller 102 can fetch access commands, such as write commands, read commands, etc., from the submission queue 2041 of the host 20, and store the fetched access commands to the cache memory 104.

In some embodiments, the non-volatile memory 108 can be implemented using a single die, which includes a plurality of blocks 1081, and each block 1081 may include a plurality of pages. For example, the non-volatile memory 108 can include 1024 blocks 1081, and each block can 1081 include 64 pages, with capacity of each page 16 KB and each block 1 MB. The aforementioned data is for purposes of description, and the manufacturer of the non-volatile memory 108 can determine the number of pages in each block 1081 and the capacity of each page. In some other embodiments, the non-volatile memory 108 includes a plurality of dies (not shown), and the blocks 1081 shown in FIG. 1 may be located on different dies.

In some embodiments, the controller 102 includes an error correction code (ECC) circuit 1021 configured to correct the page data read by the controller 102 from the non-volatile memory 108. For example, the ECC circuit 102 is a hardware circuit having an ECC capability of a predetermined error bit count, such as X bits. When the number Y of error bits of the page data read by the controller 102 from a specific word line of the non-volatile memory 108 is less than or equal to the number X, the ECC circuit 1021 can correct the error bits in the page data to correct bits using hardware error correction, and the controller 102 may further transmit the corrected page data to the host 20.

When the number Y of error bits in the page data read by the controller 102 from the non-volatile memory 108 is greater than the ECC capability of the ECC circuit 1021 (e.g., Y>X), it indicates that the ECC circuit 1021 is unable to simply use hardware error correction to correct the error bits in the page data to correct bits. At this time, the controller 102 may perform a read retry operation to read the page data from the specific word line using a next read retry voltage. When the number Y1 of error bits in the page data read from the specific word line by the controller 102 through the read retry operation is less than the ECC capability of the ECC circuit 1021, the controller 102 may send the page data corrected by the ECC circuit 1021 to the host 20. When the number Y1 of error bits in the page data read from the specific word line by the controller 102 through the read retry operation is still greater than the ECC capability of the ECC circuit 1021, the controller 102 may perform the next read retry operation until the error bits of the page data can be corrected or until the number of read retry operations reaches a predetermined number.

Figure 2:
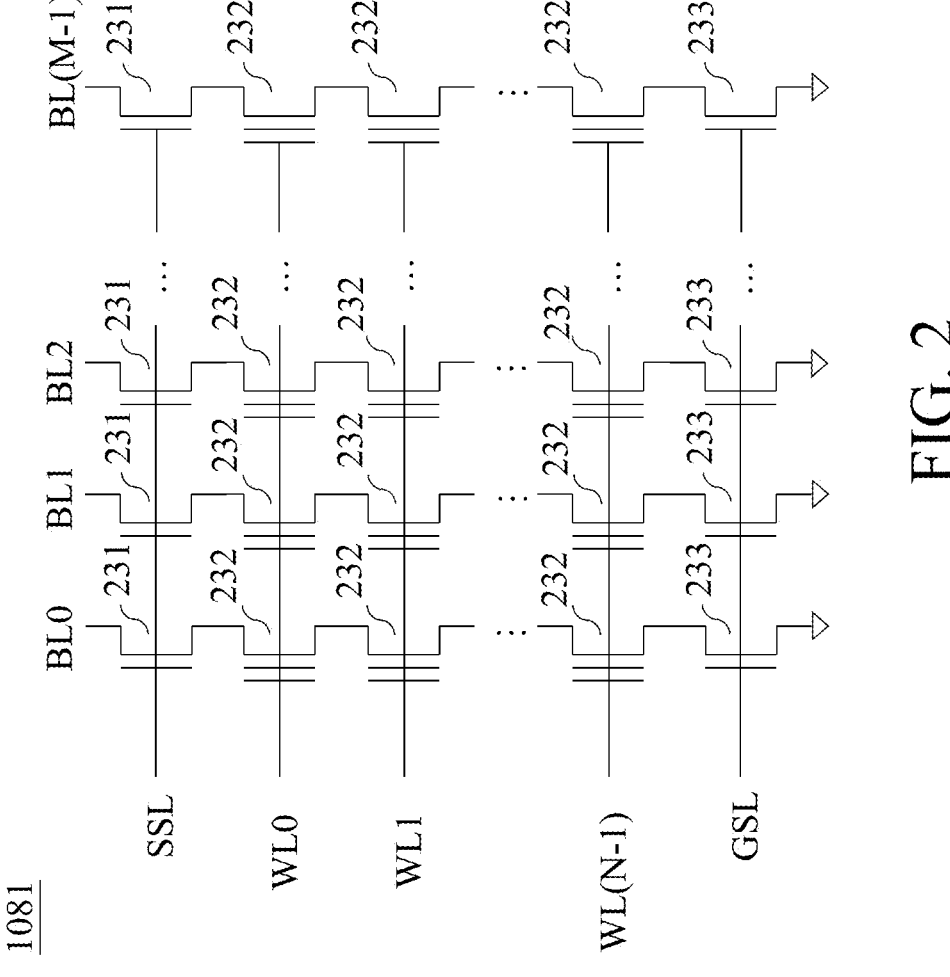
FIG. 2 is a schematic diagram of each block within a non-volatile memory in accordance with an embodiment of the present disclosure.

FIG. 2 is a schematic diagram of each block within a non-volatile memory in accordance with an embodiment of the present disclosure.

In some embodiments, each block 1081 within the non-volatile memory 108 includes a plurality of transistors 231 and 233, and a plurality of flash memory cells 232. The transistors 231 are located on the string select line SSL, and the transistors 233 are located on the ground select line GSL. For ease of description, the two-dimensional array formed by the flash memory cells 232 includes N word lines (e.g., word lines WL0 to WL(N–1)) and M bit lines (e.g., bit lines BL0 to BL(M–1)), where M and N are positive integers. In some embodiments, each block 1081 includes a plurality of word lines, and the flash memory cells 232 on the same word line (e.g., any of word lines WL0~WL(N–1)) constitute one or multiple pages, depending on the type of flash memory cells 232, such as single-level cells (SLC), multi-level cells (MLC), triple-level cells (TLC), quad-level cells (QLC), penta-level cells (PLC), hexa-level cells (HLC), and so on. For example, when the types of flash memory cells 232 are single-level cells, multi-level cells, triple-level cells, quad-level cells, penta-level cells, and hexa-level cells, each flash memory cell 232 can store 1, 2, 3, 4, 5, and 6 bits of data respectively, and the numbers of pages stored by the same word line are 1, 2, 3, 4, 5, and 6, respectively.

In some embodiments, when the controller 102 wants to perform a patrol read operation on block 1081 of FIG. 2, the controller 102 may assert the string selection line SSL and the ground selection line GSL to the high logic state, conducting the transistors 231 on the string select line SSL and the transistors 233 on the ground select line GSL. The controller 102 also uses a predetermined read threshold voltage to read the page data corresponding to the representative word line in each word line group. When the error bit count in the page data read from any representative word line exceeds a predetermined threshold, the controller 102 updates the read threshold voltage used by the word lines within the word line group corresponding to the representative word line according to a read threshold voltage update mechanism. The definition of representative word lines will be explained in the following paragraphs with reference to FIG. 3B and FIG. 3C.

In some embodiments, the controller 102 may actively perform a patrol read operation on the non-volatile memory

108 in the background, and the patrol read operation is based on the word line groups within each block 1081 of the non-volatile memory 108, in particular, on the representative word line for each word line group. The controller 102 performs a patrol read operation to detect blocks 1081 with increased errors, such as reading data stored in the non-volatile memory 108 every specific unit time, and performing a test process on the read page data based on the error correction results in the ECC circuit 1021. The test process, for example, compares the error bit count in the read page data with the ECC capability of the ECC circuit 1021, and updates the read threshold voltage of the word line corresponding to the page data having error bits exceeding the ECC capability.

Figure 3A:
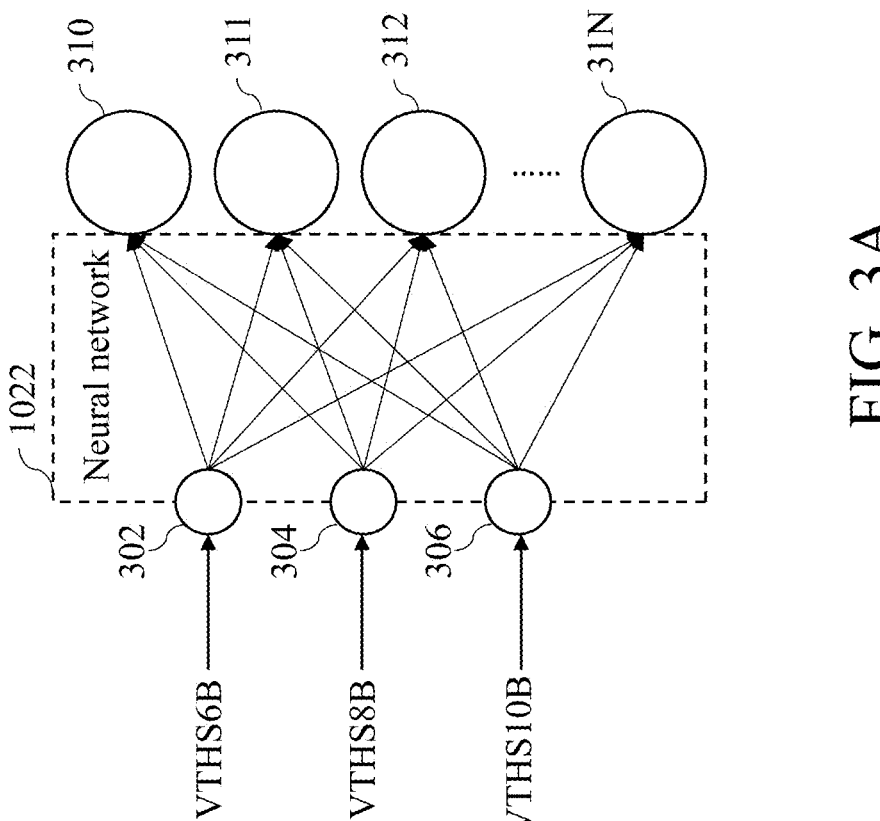
FIG. 3A is a diagram of a neural network performing word line classification based on the read threshold voltage of a specific page in accordance with an embodiment of the present disclosure.
Figure 3C:
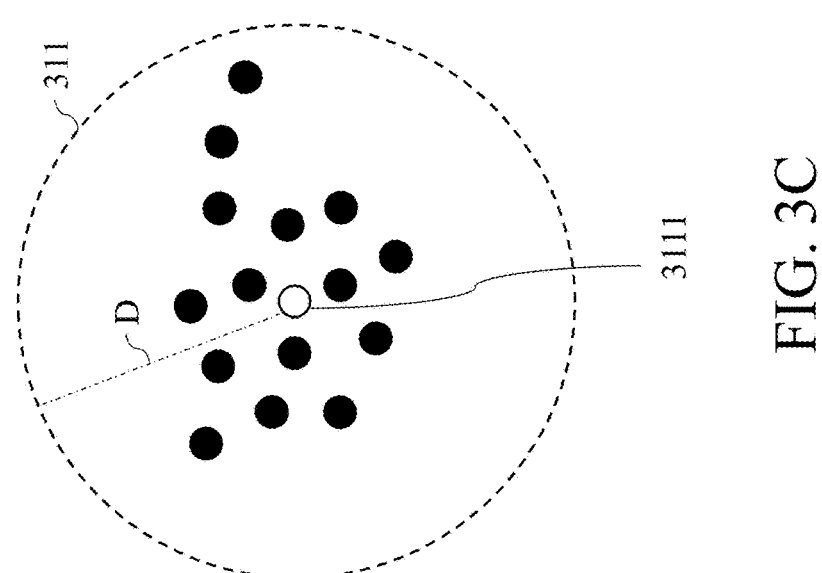
FIG. 3C is a diagram of a word line group 311 in accordance with the embodiment of FIG. 3B.
Figure 3B:
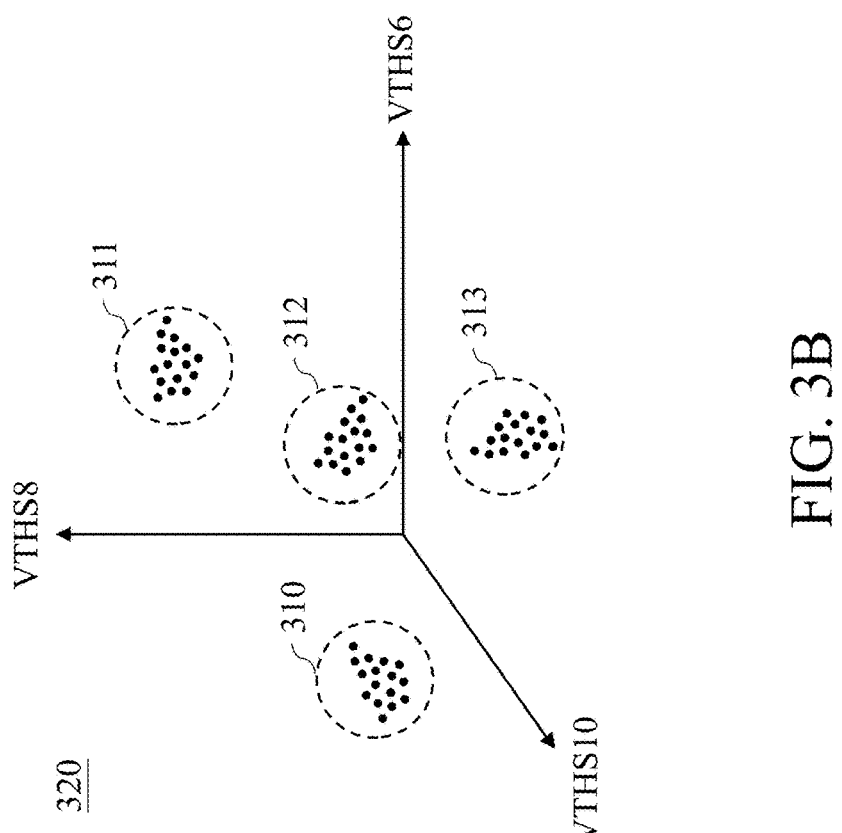
FIG. 3B is a diagram showing a word line classification using read threshold voltages in different states in accordance with an embodiment of the present disclosure.

FIG. 3A is a diagram of a neural network performing word line classification based on the read threshold voltage of a specific page in accordance with an embodiment of the present disclosure. FIG. 3B is a diagram showing a word line classification using read threshold voltages in different states in accordance with an embodiment of the present disclosure. FIG. 3C is a diagram of a word line group 311 in accordance with the embodiment of FIG. 3B.

For ease of description, in the following embodiments, the flash memory cells 232 are quad-level cells as an example. In some embodiments, when the flash memory cells 232 are quad-level cells, it indicates that each flash memory cell 232 can record 4-bit data, which can be represented by 16 different data states, such as from states S0 to S15. It should be noted that the 4-bit values represented by states S0 to S15 are not continuous. In addition, the page data read by the controller 102 from the specific word line in the block 1081 may include four types of pages, such as a low page, a middle page, an up page, and a top page. For example, when the controller 102 wants to read the page data of the low page of the specific word line, the controller 102 needs to use the read threshold voltages corresponding to states S6, S8 and S10 to read the page data on the low page of the specific word line. In addition, the controller 102 can determine the optimal read threshold voltages VTHS6B, VTHS8B and VTHS10B corresponding to states S6, S8 and S10 after multiple read retry operations, indicating that the page data read from the non-volatile memory 108 has the minimum error bit count. Similarly, when the controller 102 wants to read the page data of the middle page, the up page, or the top page of the specific word line, the controller 102 can determine the optimal read threshold voltage of each state corresponding to the middle page, the up page, or the top page after multiple read retry operations.

In some embodiments, the controller 102 may input the settings of the read threshold voltages (e.g., optimal read threshold voltages) of multiple data states (e.g., states S0 to S15) corresponding to the low page, middle page, up page, and top page of each word line in the block 1081 to input nodes (e.g., input nodes 302, 304, and 306) of the neural network 1022 to perform grouping of the read threshold voltages of each word line, as shown in FIG. 3A. For ease of explanation, in FIG. 3A, the optimal read threshold voltages VTHS6B, VTHS8B and VTHS10B of the states S6, S8 and S10 corresponding to the low page of each word line are respectively input to the input nodes 302, 304, and 306 of the neural network 1022. For example, as shown in FIG. 3B, the combination of the optimal read threshold voltages VTHS6B, VTHS8B and VTHS10B of each word line can form a coordinate point in a three-dimensional topological space 320 (with the read threshold voltages VTHS6, VTHS8, VTHS10 as axes), which can be regarded as a set of read threshold voltage settings, and the read threshold voltage setting of each word line has a corresponding coordinate point. As shown in FIG. 3A, the neural network 1022 classifies the coordinate points formed by the optimal read threshold voltages VTHS6B, VTHS8B and VTHS10B of the low page of each word line into groups 310 to 31N, and the controller 102 can classify the word lines in block 1081 into a plurality of word line groups associated with groups 310 to 31N.

In some embodiments, the neural network 1022 is, for example, a Kohonen network (KN), which is a self-orga- nizing map. The neural network 1022 may utilize the topological space 320 to represent the distribution of each output value and its classification (cluster or group). The neural network 1022 does not limit the number of classified groups, but depends on the distribution of the input data. For ease of explanation, the topological space 320 shown in FIG. 3B includes groups 310, 311, 312, and 313. In some embodi- ments, the neural network 1022 can calculate the center point coordinates of each group 310 to 31N, such as using the coordinate points classified into each group to calculate the center point coordinates. It should be noted that the aforementioned center point coordinates may not corre- spond to actual existing word lines, so the controller 102 will select the coordinate point closest to the center point coor- dinates in each group 310 to 31N as the center point of each group 310 to 31N, and select its corresponding word line as the representative word line of each word line group.

In some embodiments, when the controller 102 performs a patrol read operation on the non-volatile memory 108, it reads the representative word line of each word line group. When the error bit count in the page data read from the representative word line of the word line group exceeds a predetermined threshold, the controller 102 updates the read threshold voltage of the word line in the corresponding word line group based on the read threshold voltage update mechanism. In other words, during the patrol read operation, the controller 102 determines whether to update the read threshold voltages of the word lines in the word line group based on the read results of the representative word line of each word line group.

In some embodiments, the neural network 1022 can set the distance threshold D used by each group, indicating that the distance between the center point and each coordinate point of a specific group will not exceed the distance threshold D. In some embodiments, the distance threshold D is, for example, 2 ticks, and can be adjusted according to the actual situation. One tick represents the difference in read threshold voltage between adjacent voltage levels when the controller 102 performs a read retry operation, and it is a fixed value. As shown in FIG. 3C, group 311 includes a center point 3111, and the distance D from the boundary of group 311 to center point 3111 is, for example, 2 ticks.

In some embodiments, when the maximum distance in each dimension between a new coordinate point input to the neural network 1022 and the center point 3111 of group 311 is less than or equal to the distance threshold D, the neural network 1022 will classify the new coordinate point into group 311. When the maximum distance in each dimension between a new coordinate point input to the neural network 1022 and the center point 3111 of group 311 is greater than the distance threshold D, the neural network 1022 will classify the new coordinate point into a group other than group 311. Therefore, the number of word lines in each word line group obtained by the neural network 1022 classifying the word lines in each block 1081 is non-uniform, indicating that some word line groups contain more word lines and some contain fewer word lines.

It should be noted that the aforementioned embodiment describes that the neural network 1022 executed by the controller 102 can classify the word lines of a specific block 1081 into multiple word line groups, determine the repre- sentative word line from each word line group, and deter- mine whether to select a refresh indicator word line based on the coordinate distribution of each word line group. Each word line group has a representative word line, but not necessarily a refresh indicator word line.

For example, for multiple word lines classified into the same word line group, their respective read threshold volt- ages will be close to the read threshold voltage of the representative word line of the same word line group. However, there may still be a specific word line in the same word line group, whose read threshold voltage has a rela- tively large voltage deviation compared to the read threshold voltage of the representative word line (for example, it may exceed 2 ticks). Therefore, the controller 102 can set the specific word line with a voltage deviation exceeding a predetermined threshold and an error bit count greater than a predetermined ratio to be the refresh indicator word line of the word line group. During the patrol read operation performed on the non-volatile memory 108 by the controller 102, when the controller 102 reads the refresh indicator word line and the error bit count of the obtained page data exceeds the ECC capability of the ECC circuit 1021 within a predetermined number of read retry operations, the con- troller 102 determines that the data stored in the word lines in the word line group where the refresh indicator word line is located needs to be migrated. In some embodiments, the controller 102 can determine that the data store in the block 1081 where the refresh indicator word line is located needs to be migrated.

In some embodiments, the neural network 122 executed by the controller 102 may also classify the word lines of the specific block 1081 into multiple word line groups for reading the middle page, up page, and top page, determine the representative word line from each word line group (similar to groups 310 to 31N in FIG. 3A), and determine whether to select a refresh indicator word line based on the coordinate distribution of each group in a similar manner. In addition, at least one word line group within all word line groups for reading the low page, middle page, up page, and top page may have a refresh indicator word line. In other embodiments, after the controller 102 has classified the word lines of the specific block 1081 into multiple word line groups for reading a certain page type (e.g., top page), the controller 102 may no longer classify the word lines of the specific block 1081 separately for reading other page types (e.g., the low page, middle page, and up page), but instead uniformly use the word line groups obtained for reading a specific page type, such as the top page.

For example, for ease of description, a specific block 1081 may include 100 word lines numbered from 0 to 99. Through classification by the neural network 1022, these 100 word lines are classified into 20 word line groups (referred to as groups in Table 1), numbered from 1 to 20, as shown in Table 1. Table 1 illustrates the word line groups in the specific block 1081, the corresponding word line (WL) numbers, and the representative word line numbers and refresh indicator word line numbers for the low page (LP), middle page (MP), up page (UP), and top page (TP).

9

TABLE 1

| Group | WL number | Representative WL number | | | | Refresh indicator WL number | | | |
|---|---|---|---|---|---|---|---|---|---|
| | | LP | MP | UP | TP | LP | MP | UP | TP |
| 1 | 0, 2, 12, 23, 48, 60 | 48 | 12 | 2 | 23 | N/A | N/A | N/A | N/A |
| 2 | 4, 15, 16, 26, 47, 100 | 15 | 15 | 100 | 47 | 100 | N/A | 4 | N/A |
| ... | ... | ... | ... | ... | ... | ... | ... | ... | ... |
| 20 | 6, 7, 14, 28, 31, 52, 80 | 28 | 6 | 52 | 52 | 14 | N/A | N/A | N/A |

As an example, word line group 1 includes word line numbers 0, 2, 12, 23, 48, and 60. In addition, the controller 102 can determine the representative word lines and numbers thereof for the low pages, middle pages, up pages, and top pages based on the groups in the topological space (similar to the topological space 320 shown in FIG. 3B) established by the neural network 1022, for example, the representative word lines and numbers thereof for the low pages, middle pages, up pages, and top pages in word line group 1 are 48, 12, 2, and 23, respectively.

As an example, word line group 20 includes word line numbers 6, 7, 14, 28, 31, 52, and 80. In addition, the controller 102 can determine the representative word lines and numbers thereof for the low pages, middle pages, up pages, and top pages, such as 28, 6, 52, and 52, respectively, based on the groups in the topological space (such as the topological space 320 shown in FIG. 3B).

In other words, for word line group 1, the controller 102 uses the read threshold voltages of multiple data states corresponding to word line numbers 48, 12, 2, and 23 to perform read operations when checking the page data for the low pages, middle pages, up pages, and top pages, respectively. For word line group 20, the controller 102 uses the read threshold voltages of multiple data states corresponding to word line numbers 28, 6, 52, and 52 to perform read operations when checking the page data for the low pages, middle pages, up pages, and top pages, respectively.

In the embodiment of Table 1, word line groups 2 and 20 include refresh indicator word lines for partial page types, while word line group 1 does not include refresh indicator word lines for the low pages, middle pages, up pages, and top pages. For example, word line group 2 includes refresh indicator word lines numbered 100 and 4 for the low pages and up pages, respectively, but does not include corresponding refresh indicator word lines for the middle pages and top pages. The refresh indicator word line number for low pages in word line group 20 is 14. However, word line group 20 does not include refresh indicator word lines for middle pages, up pages, and top pages.

In some embodiments, when the controller 102 performs a patrol read operation on the non-volatile memory 108, it reads the representative word line of each word line group and determines whether to update the read threshold voltage of the word lines in the each word line group based on the read result of the representative word line. In addition, if the word line group contains a refresh indicator word line, the controller 102 will also read the refresh indicator word line and determine whether to perform data migration on the stored data of the word lines in the word line group based on the read result of the refresh indicator word line. In some embodiments, the controller 102 can determine whether to perform data migration on the stored data of the block 1081 where the refresh indicator word line is located based on the read result of the refresh indicator word line.

10

Figure 4:
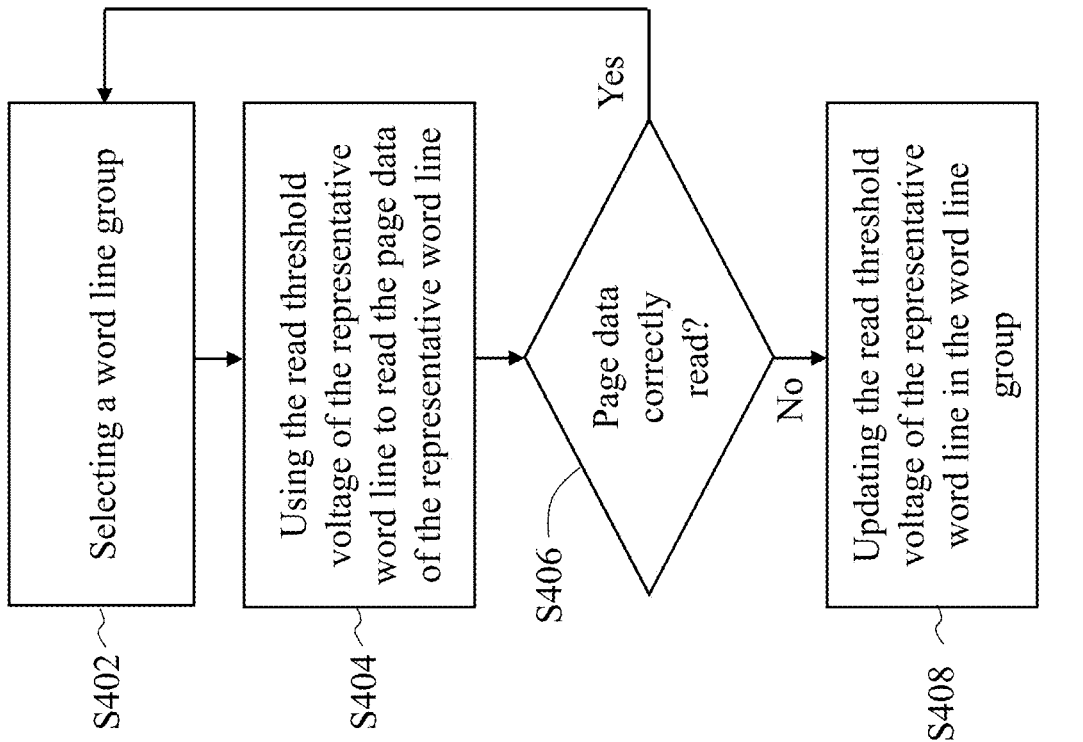
FIG. 4 is a flowchart of a patrol read method using word line grouping in accordance with an embodiment of the present disclosure.

FIG. 4 is a flowchart of a patrol read method using word line grouping in accordance with an embodiment of the present disclosure.

Taking the word line grouping in Table 1 as an example, for ease of description, the controller 102 performs a patrol read operation to read low pages within block 1081. Similar patrol read operations can be used for other types of pages. In step S402, during a patrol read operation of block 1081, the controller 102 first selects a word line group, such as word line group 1. In step S404, when the controller 102 checks word line group 1, the controller 102 uses the read threshold voltage of the representative word line WL48 to read the page data of the representative word line WL48. For example, the controller 102 uses the read threshold voltage of the representative word line WL48 to read the page data from the representative word line WL48. In some embodiments, the read threshold voltage of the representative word line may be the default read threshold voltage or a previously updated read threshold voltage. In some embodiments, the read threshold voltage of the representative word line may be set to the read threshold voltage for the corresponding word line group, which is the read threshold voltage commonly used by the word lines in the word line group.

In step S406, the controller 102 determines whether the page data was correctly read in step S404. If the controller 102 can correctly read the page data using the read threshold voltage of the representative word line WL48 (step S406: yes), meaning that the error bit count in the page data read from the representative word line WL48 using its read threshold voltage is less than the ECC capability of the ECC circuit 1021. Then, the controller 102 does not need to update the read threshold voltage of the word lines in the word line group, and does not need to perform patrol read operations on the other word lines in the word line group. Subsequently, the flow 400 returns to step S402, and the controller 102 selects the next word line group (e.g., word line group 2) to perform the patrol read operation. If the controller 102 cannot correctly read the page data from the representative word line WL48 using its read threshold voltage (step S406: no), meaning that the error bit count in the page data read from the representative word line WL48 using its read threshold voltage is greater than the ECC capability of the ECC circuit 1021. Then, the flow 400 proceeds to step S408, and the controller 102 updates the read threshold voltage of the representative word line in word line group 1.

In some embodiments, in step S408, the controller 102 performs a read retry operation on the representative word line of the selected word line group to update the read threshold voltage corresponding to the representative word line. For example, the controller 102 gradually adjusts the read threshold voltage of the representative word line WL48 (e.g., by one tick difference from the previous read threshold voltage), and sequentially reads the page data from the representative word line WL48 using the adjusted read threshold voltages. When one of the adjusted read threshold voltages can correctly read the page data from the representative word line WL48, meaning that the error bit count in the page data read from the representative word line WL48 using that adjusted read threshold voltage is less than the ECC capability of the ECC circuit 1021. Thus, the controller 102 updates the read threshold voltage of the representative word line WL48 to the adjusted read threshold voltage, and completes the operation of updating the read threshold voltage of the representative word line WL48.

In some embodiments, in step S408, the controller 102 updates the read threshold voltage corresponding to the representative word line of the selected word line group, and directly sets the updated read threshold voltage of the representative word line to the read threshold voltage of the selected word line group. In the embodiment, the read threshold voltage of the representative word line is set to the read threshold voltage of its corresponding word line group, which is the read threshold voltage commonly used by the word lines in the word line group. For example, the controller 102 updates the read threshold voltage corresponding to the representative word line WL48 of the selected word line group 1, and directly sets the updated read threshold voltage of the representative word line WL48 to the read threshold voltage of the selected word line group 1. That is, the updated read threshold voltage of the representative word line WL48 is directly used as the read threshold voltage of the other word lines WL0, WL2, WL12, WL23, and WL60 in the selected word line group 1. This is equivalent to updating the read threshold voltage of the other word lines WL0, WL2, WL12, WL23, and WL60 in the selected word line group 1 to the updated read threshold voltage of the representative word line WL48.

In some embodiments, the controller 102 may determine whether the selected word line group contains a refresh indicator word line. If so, the controller 102 uses the read threshold voltage of the refresh indicator word line to read the page data of the refresh indicator word line, and determines whether the page data of the refresh indicator word line can be correctly read. If the controller 102 can correctly read the page data of the refresh indicator word line using the read threshold voltage of the refresh indicator word line, the controller 102 does not perform any additional operations. On the other hand, if the controller 102 cannot correctly read the page data of the refresh indicator word line using the read threshold voltage of the refresh indicator word line, the controller 102 performs a data migration operation on the page data stored in each word line of the selected word line group. In some embodiments, the controller 102 performs a data migration operation on the data stored in the block 1081 where the refresh indicator word line is located.

For example, during the patrol read operation, the controller 102 selects word line group 20 for inspection, and determines that word line group 20 contains the refresh indicator word line WL14. The controller 102 then uses the read threshold voltage of the refresh indicator word line WL14 to read the page data of the refresh indicator word line WL14. If the controller 102 can correctly read the page data of the refresh indicator word line WL14 using the read threshold voltage of the refresh indicator word line WL14, the controller 102 does not perform any additional operations. On the other hand, if the controller 102 cannot correctly read the page data of the refresh indicator word line WL14 using the read threshold voltage of the refresh indicator word line WL14, the controller 102 performs a data migration operation on the page data stored in the word lines WL6, WL7, WL14, WL28, WL31, WL52, and WL80 of word line group 20. In some embodiments, the controller 102 may only perform a data migration operation on the page data stored in the refresh indicator word line WL14 of word line group 20. In some embodiments, the controller 102 may perform a data migration operation on the data stored in the block 1081 where the refresh indicator word line WL14 is located.

FIG. 5 is a flowchart of a word line classification method in accordance with the embodiment of FIG. 4. Please refer to both FIG. 1 and FIG. 5.

In step S510, the read threshold voltage associated with each word line in each block 1081 of the non-volatile memory 108 is obtained. For example, the read threshold voltage of each word line includes multiple read threshold voltages corresponding to multiple data states for different page types, where the page type depends on the type of flash memory cells in the non-volatile memory 108, such as single-level cells, multi-level cells, triple-level cells, quad-level cells, penta-level cells, hexa-level cells, etc. Taking a quad-level cell as an example, each of its low page, middle page, up page, and top page has corresponding multiple data states. Each word line in each block 1081 has a default read threshold voltage for each data state, which can be the optimal read threshold voltage for each data state (e.g., minimizing the error bit amount of page data) obtained after testing each word line, or the updated read threshold voltage after a read retry process.

In step S520, the read threshold voltage associated with each word line in each block 1081 is input to the neural network 1022 to classify the word lines in each block 1081 into multiple word line groups. For example, the neural network 1022 can be a Kohonen network (KN), which can use the read threshold voltages of the word lines in each block 1081 corresponding to multiple data states for different page types to establish a topological space (e.g., the topological space 320 shown in FIG. 3B), and classify multiple sets of read threshold voltages in the topological space into multiple groups, indicating that the controller 102 can correspondingly classify the word lines in each block 1081 into multiple word line groups, where each word line group includes at least one word line. It should be noted that the neural network 1022 can set the distance threshold D used by each group, indicating that the distance between the center point and each coordinate point of a specific group will not exceed the distance threshold D, such as 2 ticks, and can be adjusted according to the actual situation.

In step S530, the controller 102 sets the representative word lines of each word line group based on the read threshold voltages associated with each word line group. In some embodiments, the controller 102 can also set the refresh indicator word lines corresponding to certain word line groups. Then, in step S540, during the patrol read process, the controller 102 is utilized to sequentially select the word line groups, read the representative word lines of the selected word line group, and determine whether to update the read threshold voltage of the representative word line in the selected word line group based on the reading result of the representative word line, as shown in the flowchart of FIG. 4. In some embodiments, if the selected word line group contains the refresh indicator word line, the controller 102 will also read the refresh indicator word line and determine whether to perform data migration for the data stored in the word lines of the selected word line group, or for the data stored in the block 1081 where the refresh indicator word line are located.

In view of the above, the present disclosure provides a solid-state storage device and a patrol read method using word line grouping, which can read the representative word line and refresh indicator word line (if any) of each word line group in each block 1081 during a patrol read process for each block 1081, and determine the subsequent operations based on the read result, without the need to read other word lines other than the representative word line and refresh indicator word line of each word line group. Therefore, while maintaining the data reliability of the solid-state storage device 10, the patrol read method using word line grouping proposed by the present disclosure can significantly reduce the time required for the solid-state storage device 10 to perform patrol read operations, and reduce the probability of conflicts between the solid-state storage device 10 and the patrol read operation during read or write operations, thereby improving the performance of the solid-state storage device 10.

Although the present disclosure is disclosed herein with preferred embodiments, it is not intended to limit the scope of the present disclosure. Persons of ordinary skill in the art can make some modifications without departing from the spirit and scope of the present disclosure. Therefore, the scope of the present disclosure shall be determined by the appended claims.

What is claimed is:

1. A solid-state storage device, comprising:
a controller; and
a non-volatile memory, electrically connected to the controller, wherein the non-volatile memory comprises a plurality of blocks, each block comprises a plurality of word lines, and each word line has a corresponding read threshold voltage;
wherein the controller is configured to select a first word line group from a plurality of word line groups, and the plurality of word line groups are obtained by classifying the word lines based on the read threshold voltage of each word line, and a representative word line corresponding to each word line group is set based on the read threshold voltage associated with each word line group;
wherein the controller is further configured to use the read threshold voltage of a first representative word line corresponding to the first word line group to read page data of the first representative word line; and
wherein when the controller cannot correctly read the page data of the first representative word line using the read threshold voltage of the first representative word line, the controller is further configured to update the read threshold voltage of the first representative word line in the first word line group;
wherein the read threshold voltage corresponding to each word line in each block is input to a neural network, and the neural network is configured to establish a topological space using the read threshold voltage corresponding to each word line in each block, and classify the read threshold voltages within the topological space into a plurality of groups, wherein the groups correspond to the word line groups.

2. The solid-state storage device of claim 1, wherein when the controller correctly reads the page data of the first representative word line using the read threshold voltage of the first representative word line, the controller is further configured to select a second word line group from the plurality of word line groups to perform a patrol read operation.

3. The solid-state storage device of claim 1, wherein the neural network is further configured to calculate a center point of each group according to a plurality of coordinate points formed by the read threshold voltages of each group, and the word line closest to the center point of each word line is the representative word line of each word line group.

4. The solid-state storage device of claim 3, wherein the controller is further configured to determine whether to set a refresh indicator word line for each word line group according to a distribution of the coordinate points within each group.

5. The solid-state storage device of claim 4, wherein when the first word line group has the set refresh indicator word line, the controller is further configured to read the refresh indicator word line of the first word line group, and determine whether to perform a data migration operation on stored data of the block where the first word line group is located based on a read result of the refresh indicator word line of the first word line group.

6. A patrol read method using word line groupings, for use in a solid-state storage device, wherein the solid-state storage device comprises a controller and a non-volatile memory, the non-volatile memory comprises a plurality of blocks, each block comprises a plurality of word lines, and each word line has a corresponding read threshold voltage, the method comprising:
utilizing the controller to select a first word line group from a plurality of word line groups, wherein the plurality of word line groups are obtained by classifying the word lines based on the read threshold voltage of each word line, and a representative word line corresponding to each word line group is set based on the read threshold voltage associated with each word line group;
utilizing the controller to use the read threshold voltage of a first representative word line corresponding to the first word line group to read page data of the first representative word line; and
when the controller cannot correctly read the page data of the first representative word line using the read threshold voltage of the first representative word line, utilizing the controller to update the read threshold voltage of the first representative word line in the first word line group;
wherein the read threshold voltage corresponding to each word line in each block is input to a neural network, and the neural network is configured to establish a topological space using the read threshold voltage corresponding to each word line in each block, and classify the read threshold voltages within the topological space into a plurality of groups, wherein the groups correspond to the word line groups.

7. The method of claim 6, further comprising: when the controller correctly reads the page data of the first representative word line using the read threshold voltage of the first representative word line, utilizing the controller to select a second word line group from the plurality of word line groups to perform a patrol read operation.

8. The method of claim 7, wherein the neural network is further configured to calculate a center point of each group according to a plurality of coordinate points formed by the read threshold voltages of each group, and the word line closest to the center point of each word line is the representative word line of each word line group.

9. The method of claim 8, further comprising: utilizing the controller to determine whether to set a refresh indicator word line for each word line group according to a distribution of the coordinate points within each group.

10. The method of claim 9, further comprising: when the first word line group has the set refresh indicator word line, utilizing the controller to read the refresh indicator word line of the first word line group, and to determine whether to perform a data migration operation on stored data of the block where the first word line group is located based on a read result of the refresh indicator word line of the first word line group.

* * * * *